United States Patent
Banan et al.

(10) Patent No.: US 6,312,517 B1
(45) Date of Patent: Nov. 6, 2001

(54) MULTI-STAGE ARSENIC DOPING PROCESS TO ACHIEVE LOW RESISTIVITY IN SILICON CRYSTAL GROWN BY CZOCHRALSKI METHOD

(75) Inventors: Mohsen Banan, Grover; Milind Kulkarni, St. Louis; Charles Whitmer, II, St. Peters, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/568,751

(22) Filed: May 11, 2000

(51) Int. Cl.$^7$ .................................................. C30B 15/04
(52) U.S. Cl. .................. 117/13; 117/14; 117/17; 117/19; 117/932
(58) Field of Search .................. 117/13, 14, 17, 117/19, 932

(56) References Cited

U.S. PATENT DOCUMENTS

| | | | |
|---|---|---|---|
| 4,980,015 | * 12/1990 | Ono et al. | 117/932 |
| 5,242,531 | * 9/1993 | Klingshirn et al. | 117/932 |

FOREIGN PATENT DOCUMENTS

| | | | |
|---|---|---|---|
| 0 635 588 A1 | 1/1995 | (EP) | C30B/15/04 |
| 0 635 588 B1 | 1/1995 | (EP) | C30B/15/04 |
| 9227275 A | 9/1997 | (JP) | C30B/15/04 |
| WO 97/36024 | 10/1997 | (WO) | C30B/15/04 |
| WO 98/35074 | 8/1998 | (WO) | C30B/15/02 |

\* cited by examiner

*Primary Examiner*—Robert Kunemund
(74) *Attorney, Agent, or Firm*—Senniger, Powers, Leavitt & Roedel

(57) ABSTRACT

A method of lowering the resistivity of resultant silicon crystal from a Czochralski crystal growing process by adding arsenic dopant to the melt in multiple stages.

8 Claims, 5 Drawing Sheets

FIG. 2

| CRYSTAL LOCATION (% solidified) | As CONCENTRATION IN CRYSTAL (atoms/cm³) | As CONCENTRATION IN CRYSTAL (g/cm³) | As CONCENTRATION IN MELT (g/cm³) | TOTAL As IN MELT (g) | CRYSTAL RESISTIVITY (mΩ-cm) |
|---|---|---|---|---|---|
| 8.3% | 1.4e19 | 1.74e-3 | 5.8e-3 | 74.23 | 5.5 |
| 22.7% | 1.6e19 | 1.99e-3 | 6.63e-3 | 71.51 | 5 |
| 32.3% | 1.8e19 | 2.24e-3 | 7.45e-3 | 70.33 | 4.7 |
| 46.1% | 1.9e19 | 2.36e-3 | 7.87e-3 | 59.15 | 4.4 |

INITIAL MELT MASS = 35 kg
DOPANT FEED = 190 g
DEAD TIME = 46.5 hours

US 6,312,517 B1

MULTI-STAGE ARSENIC DOPING PROCESS TO ACHIEVE LOW RESISTIVITY IN SILICON CRYSTAL GROWN BY CZOCHRALSKI METHOD

BACKGROUND OF THE INVENTION

The present invention relates to a multi-stage arsenic doping process to achieve low resistivity in silicon crystal grown by Czochralski method.

Arsenic is an ideal dopant used to achieve lower resistivity in silicon crystals grown by Czochralski process because of its high solubility in silicon. However arsenic is highly volatiles at temperature higher than 617° C. The Surface of the silicon melt: is at its melting point (1412° C.) or higher. In popular practice, arsenic is fed into the melt from a feed hopper located a few feet. above the melt level. However, due to higher temperatures, loss of arsenic to surrounding environment (argon gas) is violent, which results in generation of particles. Generation of oxide-particles (sub-oxides) is enhanced by local reduction in temperature caused by sublimation of arsenic. These particles can act as heterogeneous nucleation sites and often result in failure of the crystal pulling process. Excessive generation of particles does not allow sufficient doping of arsenic to achieve higher arsenic concentrations in the melt required to achieve lower resistivity targets.

SUMMARY OF THE INVENTION

The present invention overcomes the above described difficulties and disadvantages associated with such prior art processes by introducing arsenic in multiple stages such that particle generation per stage is decreased whereas the particle removal capacity of the crystal puller, which is a strong function of argon flow rate, remains practically unchanged. For example the following mass balance in the continuum sense must hold:

Rate of particle accumulation=Rate of particle generation—Rate of particle removal $$\frac{dn}{dt} = r_g - r_r \quad (1)$$

where n is number of particles in the crystal puller, t is time (s), $r_g$ is the rate of generation of particles (number/s) and $r_r$ is the rate of particle removal (number/s) Also, in the continuum sense total number of particles is given by following equality:

Number of particles=Number of particles initially present+Integral of difference between rate of particle generation and rate of particle removal $$n = n_0 + \int_0^t \frac{dn}{dt} dt \quad (2)$$

$$= n_0 + \int_0^t (r_g - r_r) dt$$

$$= n_0 + \int_0^t F(feedrate, argonflowrate) dt$$

where $n_0$ is the initial number of particles present and F(feed rate, argon flow rate) is a function of arsenic feed rate and argon flow rate. Equation (2) indicates that as the arsenic feed rate decreases the total particle count in the crystal puller decreases. A continuous process with a lower arsenic feed rate can be closely mimicked by a multi-stage process in which arsenic is fed in multiple stages. In a single-stage process total amount of arsenic is fed at once. In such a process rate of particle generation is very high such that rate of particle removal cannot match the rate of particle generation and, hence, the number of particles in the crystal puller increases. In a multi-staged process the amount of arsenic fed per stage decreases by a factor of the number of stages. Thus, in a multi-staged process the rate of particle generation is decreased and the total number of particles in the crystal puller is lower. Thus, the possibility of process failures due to particle related dislocations or loss of crystal structures is greatly reduced.

Other objects and features will be in part apparent and in part pointed out hereinafter.

BRIEF DESCRIPTION OF THE DRAWINGS

FIG. 2 is a SIMS data chart for a typical Czochralski crystal grown in a 15" Hamco puller;

DETAILED DESCRIPTION OF PREFERRED EMBODIMENTS

Figure 1:
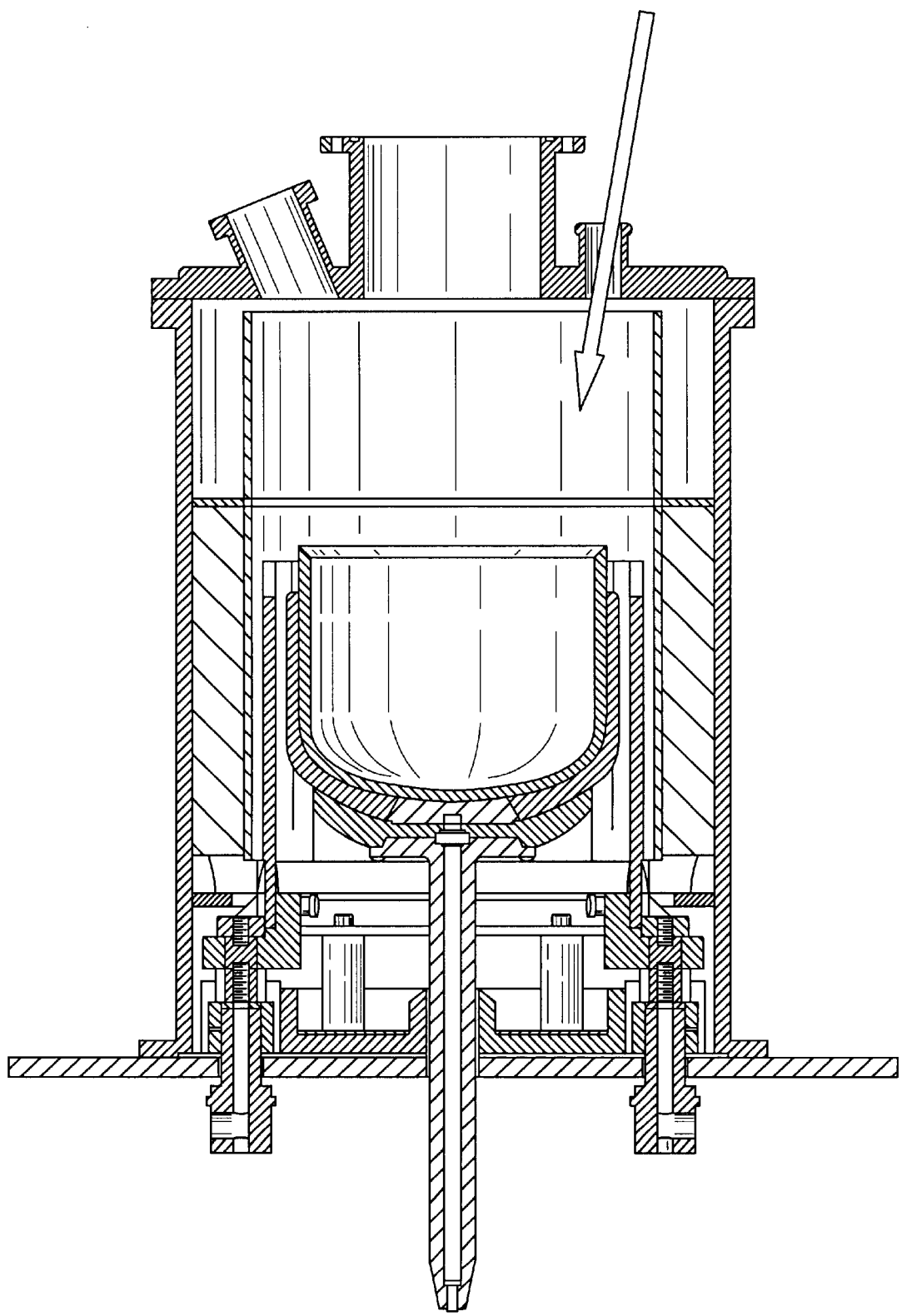
FIG. 1 is a cross-sectional view of a 15" Hamco crystal puller showing the insertion point for dopant in the furnace chamber.

Several embodiments for a multi-stage arsenic doping process to achieve low resistivity in silicon crystal grown by Czochralski method are comprised as follows.

Although it is well understood that the resistivity of the silicon wafers decreases with increasing arsenic concentration, mathematical relationship between arsenic concentration and the resistivity is not readily available. Hence, a few experiments were accomplished to collect data. One such experiment involved
1) Charging 35 kg silicon into the crystal puller manufactured by HAMCO,
2) Single stage introduction of 190 g arsenic dopant and
3) subsequent growth of a single silicon crystal.

Resistivity of the grown crystal was measured and the corresponding concentration was evaluated using SIMS data as well using resistivity-concentration relationship for phosphorous (ASTIM publication F 723-81). There is generally a time delay between the introduction of arsenic into the melt and the successful crystal growth attempt. This time delay is often referred to as 'dead time' or 'dwell time' or simply 'time delay' in this disclosure. In the above experiment the dead time was around 46.5 hours. The grown crystal was measured for its resistivity and arsenic concentration at various positions. These positions are often referred to as the percentage of solidified melt i.e., x% of solidified melt indicates the location of the crystal in contact with melt after x% of melt solidified into crystal. Also measurements taken at around 6–8% solidified melt refer to 'seed-end' data. FIG. 2 shows experimental data at various crystal locations that indicate an obvious inverse relationship between resistivity of a Czochralski crystal and the dopant (arsenic) concentration.

It must be noted that as per the seed end measurements the total mass of arsenic dissolved in the melt at the onset of crystal growth was only about 75 g. This indicates that about 115 g of the total 190 kg dopant feed was lost to argon atmosphere. Most of this arsenic is lost by sublimation of solid atomic arsenic before its dissolution into the melt. Since most of the arsenic is lost to the atmosphere by sublimation, the arsenic concentration in the crystal is very low. Obviously, corresponding resistivities are higher. Thus, in spite of high solubility of arsenic in silicon, the set low resistivity goals for the crystal (3 mΩ.cm) are not met. However, in addition to its loss to the argon atmosphere prior to its dissolution in the melt, arsenic is also lost to argon atmosphere from the melt simply by convective mass transport. The dead time becomes very critical for arsenic doped melt since arsenic exhibits very high vapor pressure. Thus the mass balance of dissolved arsenic in its simplistic form can be written as:

Rate of change of arsenic mass in melt=rate of transfer to the crystal+rate of loss by convection.

i.e., $$\frac{dC_{As,m}}{dt} = \frac{k_{As,m-Ar}(\pi r_m^2 - \pi r_x^2)(C_{As,m-Ar} - C_{As,b}) + \frac{v_x \pi r_x^2 \rho_x}{\rho_m} C_{As,m} - v_x \pi r_x^2 K_s C_{As,m}}{V_m} \quad (3)$$

$$@t = 0, \; C_{As,m} = \frac{M_{feed} - M_{loss}}{V_{m,0}}$$

where

| | |
|---|---|
| $C_{As,b}$ | bulk arsenic concentration in argon (g/cm³) |
| $C_{As,m}$ | arsenic concentration in silicon melt (g/cm³) |
| $C_{As,m-Ar}$ | arsenic concentration at melt-argon interface (g/cm³) |
| $K_s$ | concentration based segregation coefficient for arsenic between silicon crystal and melt |
| $k_{As,m-Ar}$ | mass-transfer coefficient for arsenic between melt and argon (cm/s) |
| $M_{feed}$ | Total arsenic fed (g) |
| $M_{loss}$ | Total arsenic lost before onset of crystal growth (g) |
| $r_m$ | radius of melt surface including melt-crystal interface (cm) |
| $r_x$ | radius of melt-crystal interface (cm) |
| $t$ | time (s) |
| $V_m$ | Volume of melt (cm³) |
| $V_{m,0}$ | Initial volume of melt (cm³) |
| $v_x$ | crystal pull rate (cm/s) |
| $\rho_m$ | silicon melt density (g/cm³) |
| $\rho_x$ | silicon crystal density (g/cm³) |

In the absence of crystal growth the arsenic mass balance simply reduces to the following form:

Rate of change in arsenic mass in the melt=rate of convective loss i.e., $$\frac{dC_{As,m}}{dt} = \frac{-k_{As,m-Ar}(\pi r_m^2)(C_{As,m-Ar} - C_{As,b})}{V_{m,0}} \quad (4)$$

$$@t = 0, \; C_{As,m} = \frac{M_{feed} - M_{loss}}{V_{m,0}}$$

Figure 3:
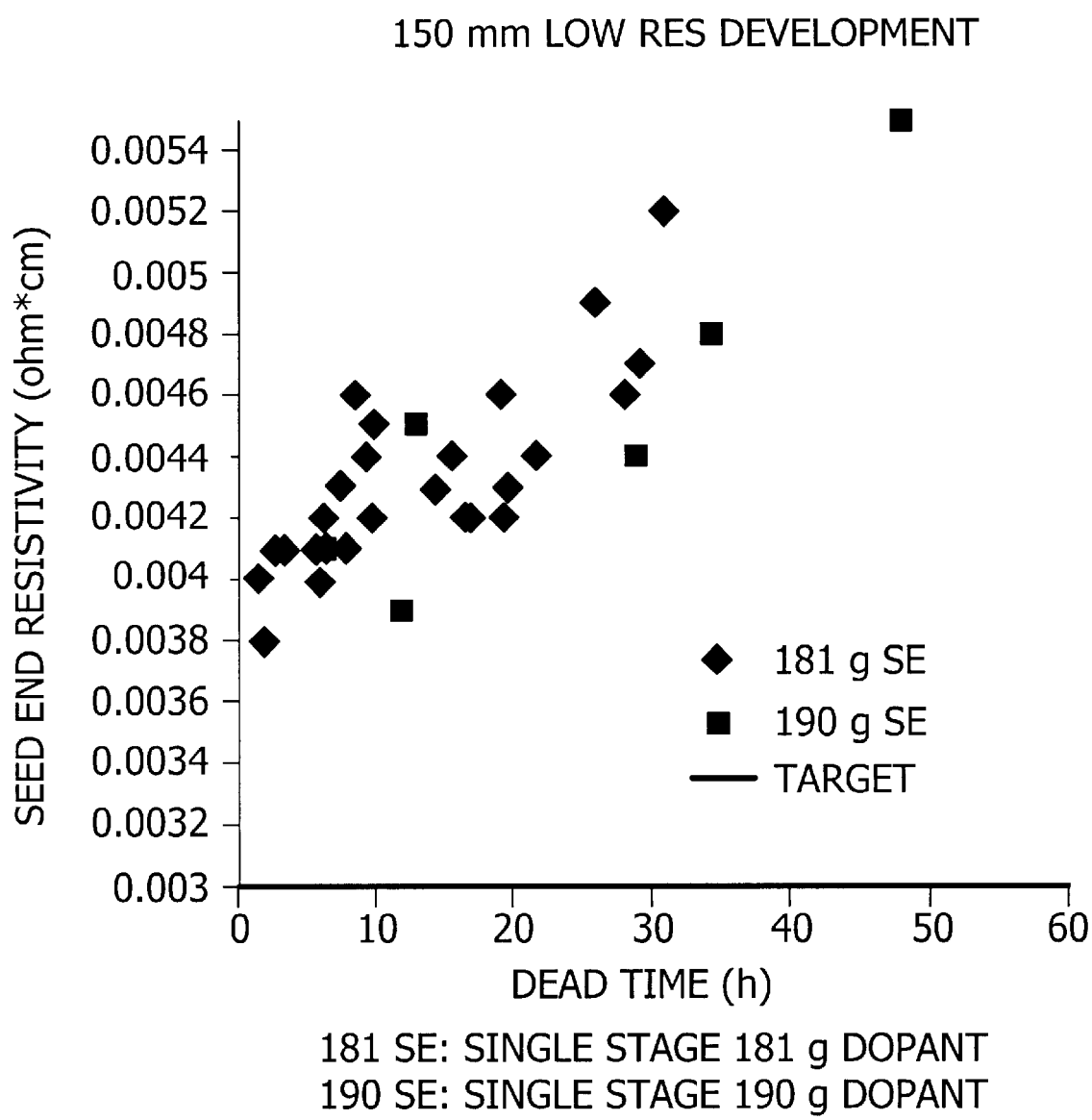
FIG. 3 is a graph of dead time vs. seed end resistivity for single stage crystal growth.

Equation (4) describes the arsenic loss from the melt only in the absence of the crystal growth. Equation (3) must be solved to account for failed crystal growth attempts (if any) and initial conditions must be appropriately modified. Equations (3) and (4) can be analytically solved by making proper approximations. However, it is not necessary to do so since our primary interest is in studying the rate of arsenic loss. Thus, it becomes evident that the concentration of arsenic in the melt and crystal decreases with increasing dwell time, and hence, the resistivity of the crystal increases with increasing dwell time. Data regarding the effect of dwell time is presented in FIG. 3.

One option to approach a low resistivity goal at the seed end could be to increase the mass of arsenic fed into the melt. However, this process is fraught with particle generation problem. Arsenic has very high vapor pressure at higher temperatures. The sublimation temperature of arsenic is 612° C. (*Material and Safety Data Sheet*, Furukawa Co. Ltd, 1999). Vapor pressure of arsenic reaches 1 atm at 610° C. (Lide, 1994). Arsenic melts at 814° C. at: vapor pressure around 35 atmospheres (D.R. Lide, *CRC Handbook of Chemistry and Physics*, 74th ed., 1993–1994). Since, the silicon melt in the Czochralski process remains at 1412° C. or higher, sublimation of arsenic before it dissolves in the melt is very rapid and often violent, which leads to excessive particle formation. Sublimation of arsenic utilizes heat from the melt, which decreases the local temperature and increases oxide and sub-oxide particle generation. As these particles can act as heterogeneous nucleation sites and/or as sites for dislocations, Czochralaski process typically results in a failure. In 15" Hamcc crystal pullers, typically, more than 190 g of arsenic cannot be added without risking the loss of crystal structure.

By introducing arsenic in multiple stages, particle generation per stage is decreased whereas the particle removal capacity of the crystal puller which is a strong function of argon flow rate remains relatively unchanged, as previously mentioned. In a single-stage process, the rate of particle generation is very high such that rate of particle removal cannot match the rate of particle generation, and, hence, the particle density (number of particles per unit volume of crystal puller) in the crystal puller increases. In a staged process the effective rate of particle generation is decreased, and, hence, the particle density in the crystal puller is lower. Thus, the possibility of process failure owing to particle related dislocations or loss of crystal structures is greatly reduced.

However, the cumulative loss of arsenic by sublimation to the argon atmosphere does not appreciably change with increasing number of stages. This is because rate of arsenic sublimation is proportional to the difference in the vapor pressure of arsenic at the arsenic-argon interface and the arsenic concentration in the bulk argon atmosphere. Since, the arsenic concentration at the interface is generally the saturation concentration given by the vapor pressure at a given temperature and bulk arsenic concentration is very low (practically zero), the driving force for arsenic sublimation does not change with the number of stages. Hence, there can be no strong functional relationship between the total loss of arsenic by sublimation per unit mass of arsenic feed and the number of stages. Arsenic feed consists of many arsenic-particles (these arsenic-particles are not to be mistaken with particles generated by arsenic sublimation which include oxides and sub-oxides). The particles generated by arsenic sublimation are referred to herein as simply 'particles' whereas physical shape of arsenic is referred to as 'arsenic-particles'. The following equation relates the arsenic loss in terms of rate of decrease in mean arsenic-particle radius by sublimation, $$\frac{dr_{As}}{dt} = \frac{k_{As-Ar}}{\rho_{As}}(C_{As,As-Ar} - C_{As,b}) \quad (5)$$

where $r_{As}$ (cm) and $\rho_{As}$ (g/cm$^3$) are radius and density of arsenic-particles, $C_{As,As-Ar}$ (g/cm$^3$) is the saturation concentration of arsenic at the arsenic-argon interface, $C_{As,b}$ (g/cm$^3$) is the bulk arsenic concentration and $k_{As-Ar}$ (cm/s) is the mass transfer coefficient for arsenic transfer from arsenic-argon interface to the bulk. Equation (5) can more accurately describe the sublimation of free arsenic-particles in the argon atmosphere. However, it becomes less accurate for sublimation of arsenic-particles temporarily staying on the melt before dissolution. In such a condition, a phenomenological mean equivalent radius of the arsenic-particles can be used. The above relationship (Equation (5)) clearly indicates that rate of change in mean arsenic radius does not change with number of stages. Thus, only particle density in the crystal puller is decreased by increasing number of arsenic feeding stages.

Figure 4:
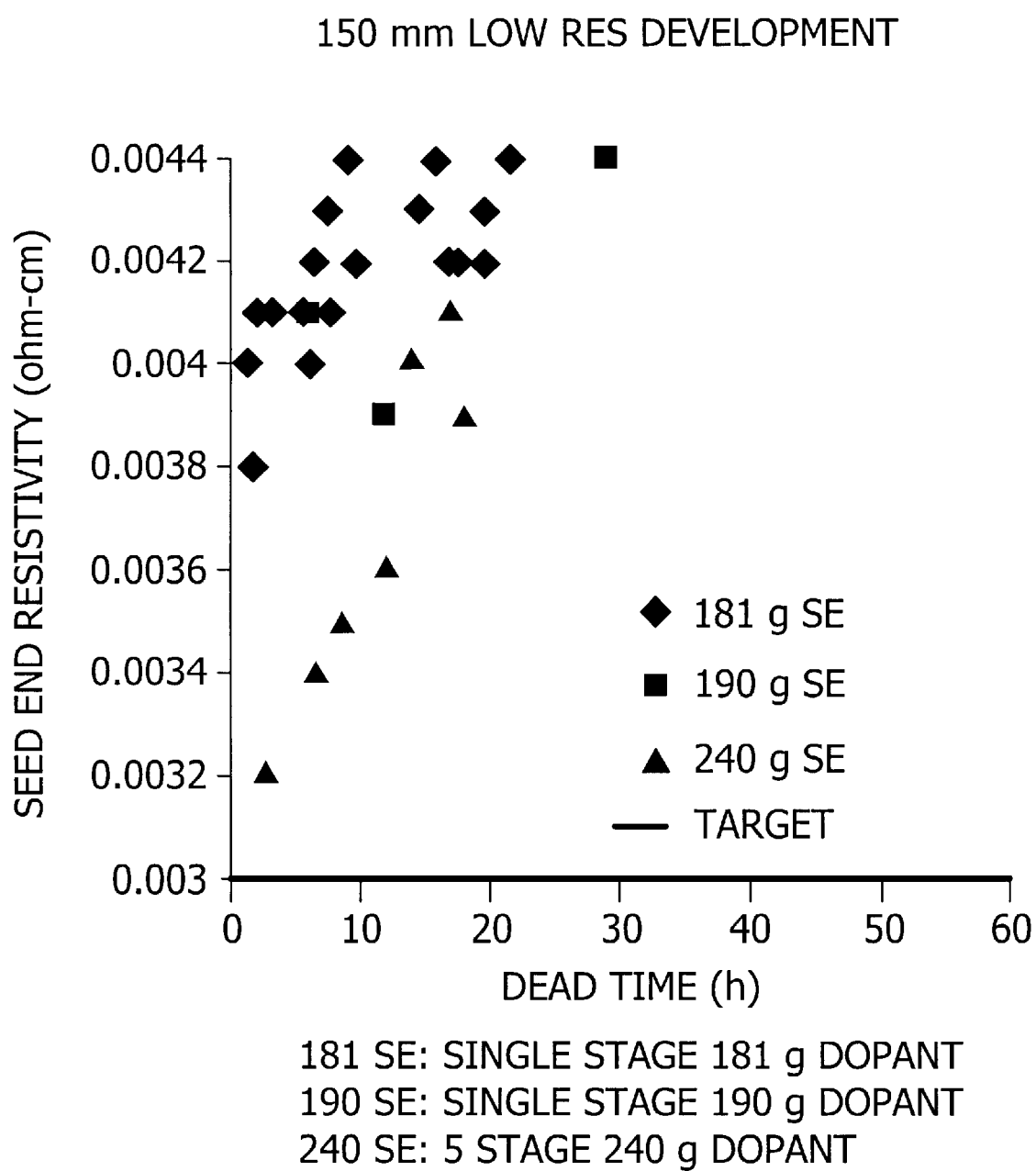
FIG. 4 is a graph of dead time vs. seed end resistivity for single and multi-stage (3–5 stage) doping in crystal growth.
Figure 5:
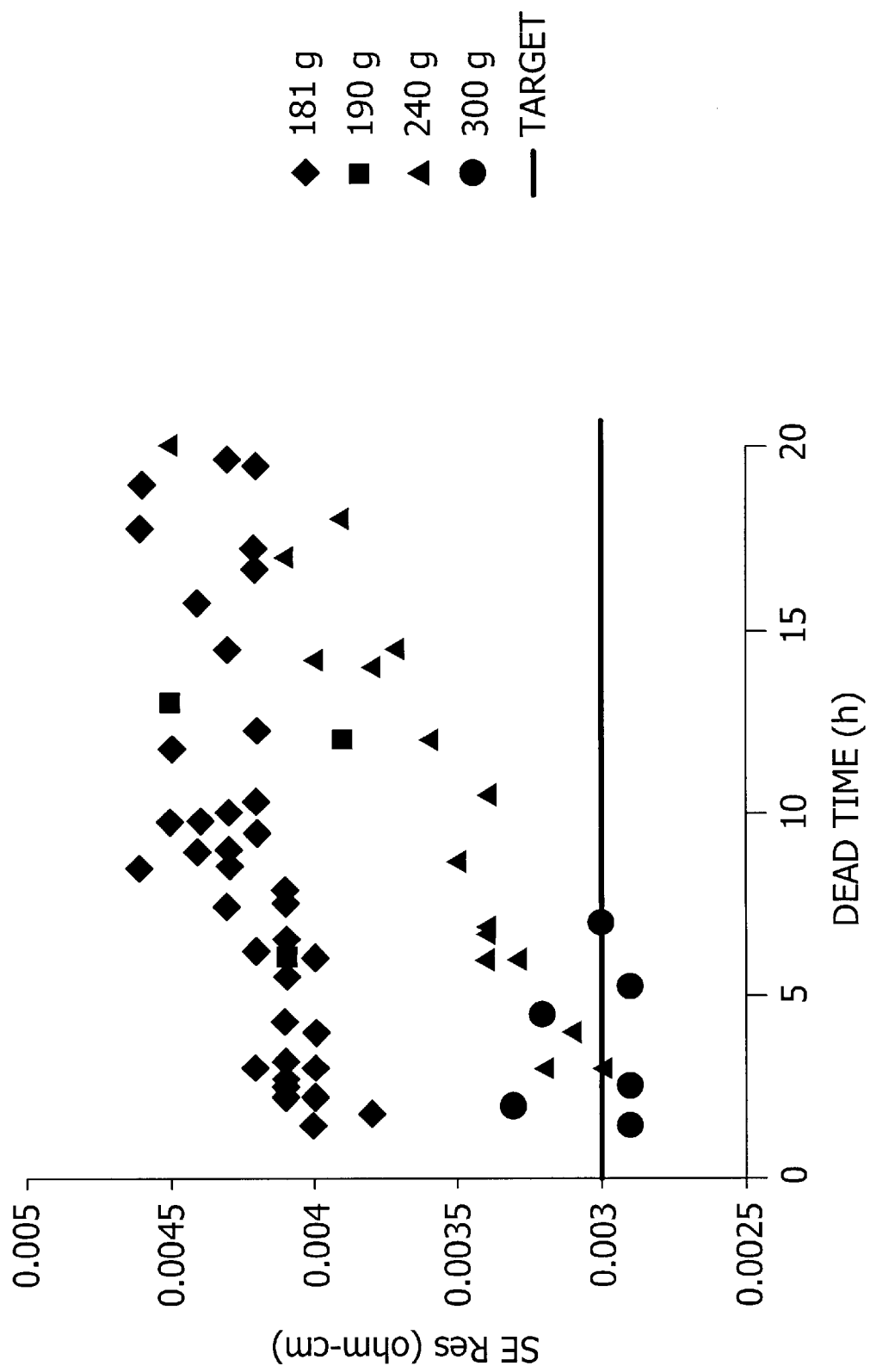
FIG. 5 is a graph similar to FIG. 4 showing additional doping results.

A series of experiments were conducted to dope 240 g of arsenic in five stages of essentially equal amounts. Seed end resistivity data as a function of dead time are shown in FIG. 4. FIG. 4 also compares the performance of 190 g single-stage process with 240 g 5-stage process. It is evident that only 240 g 5-stage process is able to reach lower resistivities with successful crystal growth. A similar comparison is made in FIG. 5 where 300 g of arsenic dopant was added in three stages of essentially equal amounts compared to 240 g in five stages and compared to 181 g and 190 g in single stages.

Another important aspect of this invention is to minimize the dead time. For very long dead times, as a result of convective loss of arsenic from the melt surface, even the 5-stage process cannot reach lower seed-end resistivities.

Thus it was theoretically proposed and experimentally shown that:

1) excessive loss of arsenic occurs to argon atmosphere before its dissolution;
2) violent sublimation of arsenic is accompanied by very high rate of particle generation;
3) the number density of particles increases with mass of arsenic fed;
4) the increased particle density causes Czochralski process failure;
5) the number density of particles can be decreased by feeding arsenic in multiple stages;
6) the rate of arsenic sublimation per unit mass does not change appreciably with the number of stages; and
7) the resistivity targets can be approached by feeding more arsenic in increased numbers of stages and by decreasing dead time.

The efficiency of the process increases with increasing the number of stages. The present invention is not limited to any particular number of stages. It is a basic aspect of the present invention that multiple staged introduction of arsenic improves upon the single staged feed into the crystal puller.

In view of the above, it will be seen that the several objects of the invention are achieved and other advantageous results attained.

As various changes could be made in the above invention, it is intended that all matter contained in the above description and shown in the accompanying drawings shall be interpreted as illustrative and not in a limiting sense.

What is claimed is:

1. A method of lowering the resistivity of resultant silicon crystal from a batch crystal growing process, comprising the steps of:

establishing a silicon melt in a crystal growing clamber; and adding solid arsenic dopant to the melt in multiple stages prior to initiating crystal growth.

2. The method of claim 1, wherein the dopant is added in at least 2 stages.

3. The method of claim 2 wherein the dopant is added in substantially equal or different amounts in each stage.

4. The method of claim 1 wherein the dead time is substantially minimized.

5. The method of claim 1 includes:

the dopant being added in multiple stages such that total particle generation is less than particle generation if total dopant were added in a single stage.

6. The method of claim 1 wherein the total dopant added to the melt is greater than that which could be added in a single stage without resulting in process failures due to particle related dislocation or loss of crystal structure during the crystal growing phase.

7. The method of claim 1 wherein dead time is equal to or less than about eight hours.

8. The method of claim 5 wherein the resistivity of resultant crystals is about 0.003 ohm-cm or less.

* * * * *